(12) United States Patent
Liu et al.

(10) Patent No.: US 7,253,508 B2
(45) Date of Patent: Aug. 7, 2007

(54) SEMICONDUCTOR PACKAGE WITH A FLIP CHIP ON A SOLDER-RESIST LEADFRAME

(75) Inventors: Chien Liu, Kaohsiung (TW); Hsueh-Te Wang, Kaohsiung (TW); Meng-Jen Wang, Pingtung (TW); Chi-Hao Chiu, Pingtung (TW); Tai-Yuan Huang, Jiading Shiang (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 40 days.

(21) Appl. No.: 11/014,165

(22) Filed: Dec. 17, 2004

(65) Prior Publication Data

US 2005/0133896 A1 Jun. 23, 2005

(30) Foreign Application Priority Data

Dec. 19, 2003 (TW) ............................... 92136315 A

(51) Int. Cl.
*H01L 23/48* (2006.01)
(52) U.S. Cl. ...................... 257/678; 257/666; 257/673; 257/669; 257/674; 257/668; 257/690; 257/778; 257/780
(58) Field of Classification Search ................ 257/666, 257/673, 669, 674, 678, 668, 690, 780, 778
See application file for complete search history.

(56) References Cited

U.S. PATENT DOCUMENTS 6,507,120 B2 1/2003 Lo et al. ...................... 257/778

6,750,546 B1* 6/2004 Villanueva et al. ......... 257/778
6,858,919 B2* 2/2005 Seo et al. .................... 257/666

FOREIGN PATENT DOCUMENTS

TW 458385 10/2001
TW 540123 7/2003

* cited by examiner

*Primary Examiner*—Sara Crane
*Assistant Examiner*—Junghwa Im
(74) *Attorney, Agent, or Firm*—Troxell Law Office, PLLC

(57) ABSTRACT

A semiconductor package includes a flip chip mounted on a plurality of leads and encapsulated by a molding compound. The upper surfaces of the leads includes a plurality of bump-bonding regions at the fan-in ends of the leads, and the lower surfaces of the leads include a plurality of outer connecting regions at the fan-out ends of the leads. A plurality of indentations are formed at the upper surfaces of the leads and adjacent to the corresponding bump-bonding regions so as to avoid solder contamination on the leads. After molding, the indentations are filled with the molding compound. Preferably, the indentations have a reversed "Ω"-shaped profile to prevent bumps of the flip chip from excessively wetting over the other portions of the leads to firmly fix the fan-in ends of the leads.

14 Claims, 3 Drawing Sheets

SEMICONDUCTOR PACKAGE WITH A FLIP CHIP ON A SOLDER-RESIST LEADFRAME

FIELD OF THE INVENTION

The present invention relates to a semiconductor package, more particularly to a semiconductor package with a flip chip on a leadframe.

BACKGROUND OF THE INVENTION

According to various requirements from customers, known semiconductor packages have various package configurations. One type of semiconductor packages is that a flip chip is mounted on a leadframe. There are a plurality of bumps formed on active surface of a flip chip to connect a plurality of leads in replacement of bonding wires for inner electrical connection within a molding compound. However, the leadframe provided for flip-chip connection is slightly different from conventional leadframe for wire-bonding connection. The leadframe has a plurality of appropriate bump-bonding regions at the fan-in end of leads corresponding to the bumps of the flip chip. However the bumps will easily wet other portions of the leads during reflowing process.

Flip-chip typed QFN packages (Quad Flat Non-leaded package) are disclosed in U.S. Pat. No. 6,507,120 (which R.O.C. Taiwan Publication Patent number is 463,342). The package mainly comprises a plurality of leads from a leadframe, a flip chip bonded to the leads via a plurality of bumps, and a molding compound for encapsulating the flip chip. A solder mask is formed on upper surfaces of the leads and has a plurality of openings corresponding to the bumps to limit the bump-bonding regions of the leads. However, the well-known solder mask is generally formed over a substrate or a printed circuit board by printing technique and covers the resin layer of substrate between traces. When the solder mask is printed on the upper surfaces of the leads, the consumption of solder mask is very large because that the thickness of the leads is much thicker than that of the well-known traces of a substrate. Moreover, since there is no supporting resin layer below the leads, a solder mask is hard to form and easily contaminates the leadframe and processing machine. Besides, the flip chip typed QFN is used for packaging as CSP (Chip Scale Package) only because the leads are quite short without fan-out design. Furthermore, the bonding strength between the leads coated with solder masked and the molding compound is weak. As a result, the leads are easily delaminated from the molding compound and short circuit occurs.

SUMMARY

It is a primary object of the present invention to provide a semiconductor package with a flip chip on a leadframe to avoid solder contamination and bump collapse. Leads of the leadframe have a plurality of bump-bonding regions at fan-in ends thereof, and a plurality of outer connecting regions at fan-out ends thereof. A plurality of indentations are formed at the upper surfaces and adjacent to bump-bonding regions at the fan-in ends of the leads in replacement of well-known solder mask on a leadframe. The bumps of the flip chip will not excessively wet and spread on the leads. Preferably, the indentations can be filled with a molding compound to firmly fix the fan-in ends of the leads. Also a leadframe for the semiconductor package is disclosed.

It is a secondary object of the present invention to provide a semiconductor package with a flip chip on a leadframe. It utilizes the indentations at the upper surfaces of the leads of the leadframe to define a plurality of bump-bonding regions. Preferably, the indentations have a reversed "Ω"-shaped profile for effectively limiting soldering area of a plurality of bumps on the flip chip. The bumps can be bonded to the bump-bonding regions of the leads without excessive diffusion during a reflowing process.

It is another object of the present invention to provide a semiconductor package with a flip chip on a leadframe with better mold locking capability. The leads of the leadframe have a plurality of recessions in the lower surfaces thereof. The recessions are formed between the indentations and the outer connecting regions, which can be filled with a molding compound for firmly fixing the leads.

In accordance with the present invention, a semiconductor package generally includes a plurality of leads from a leadframe, a flip chip and a molding compound. Each lead has an upper surface and a lower surface. The upper surfaces include a plurality of bump-bonding regions at the fan-in ends of the leads. The lower surfaces include a plurality of outer connecting regions at the fan-out ends of the leads. The leads have a plurality of indentations at the upper surfaces and adjacent to the corresponding bump-bonding regions to define the soldering area of the bump-bonding regions. The flip chip is located on the leads by connecting a plurality of bumps of the flip chip to the bump-bonding regions of the leads. The molding compound encapsulates the flip chip and the leads, but the outer connecting regions of the leads are exposed out of the molding compound. Preferably, the indentations have a reversed "Ω"-shaped profile and are filled with the molding compound to improve the mold locking capability and the stop effect of solder diffusion. In various embodiments, parts of the leads include the fan-in ends may are formed on an upset, or a plurality of recessions are formed in the lower surfaces between the indentations and the outer connecting regions, so as to improve mold locking capability of the leads within the molding compound.

DETAILED DESCRIPTION OF THE PRESENT INVENTION

Figure 1:
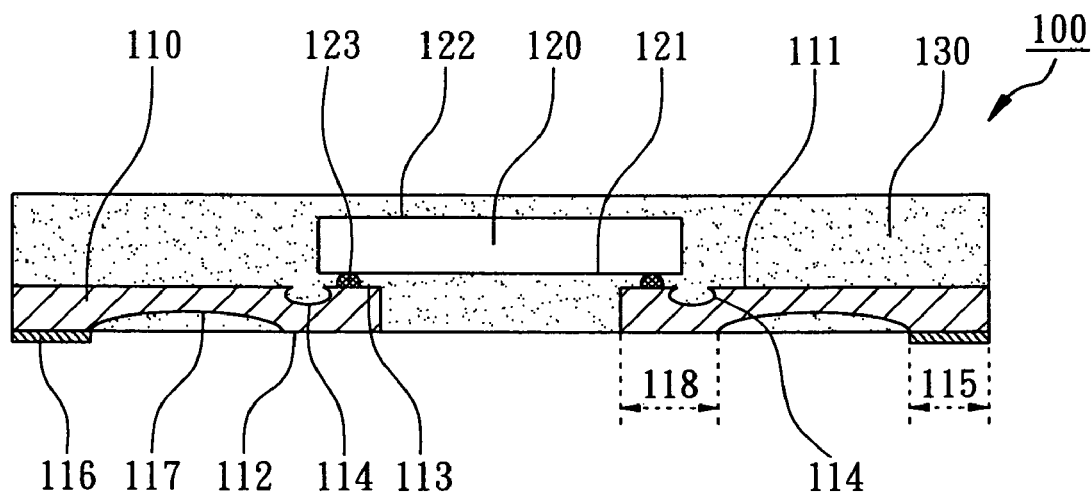
FIG. 1 is a cross sectional view of a semiconductor package in accordance with the first embodiment of the present invention.

Referring to the drawings attached, the present invention is described by means of the embodiment(s) below.

The first embodiment of the present invention discloses a semiconductor package with a flip chip on a leadframe. Referring to FIG. 1, the semiconductor package 100 mainly includes a plurality of leads 110, a flip chip 120 and a molding compound 130. The leads 110 are parts of a leadframe which is made of copper, iron or its alloy, such as leadframe for QFN (Quad Flat Non-leaded) packages or SON (Small Outline Non-leaded) packages. The leads 110 according to various types may be designed to arrange on four sides or two sides on the bottom surface of the molding compound 130. Each lead 110 has an upper surface 111 and a lower surface 112. In this embodiment, the leads 110 have a fan-out design and extend to an appropriate length preferably more than about 600 μm approximately, but there is no outer lead extending from the molding compound 130. The upper surfaces 111 of the leads 110 include a plurality of bump-bonding regions 113 at the fan-in ends of the leads 110 for soldering connection of a plurality of bumps 123 of the flip chip 120. Moreover, the lower surfaces 112 of the leads 110 include a plurality of outer connecting regions 115 at the fan-out ends of the leads 110 to serve as externally electrical connections. Preferably, an electrically conductive layer 116, such as lead tin solder, Nickel/Gold layer, tin or other known bonding materials, can be formed on the outer connecting regions 115. A plurality of indentations 114 in the shape of slot or cavity are formed at the upper surfaces 111 of the leads 110 and adjacent to the bump-bonding regions 113. The indentations 114 are created to stop soldering diffusion out of the bump-bonding regions 113. The indentations 114 may be filled with the molding compound 130. Preferably, the indentations 114 have a reversed "Ω"-shaped profile. For example, formed between the openings of the indentations 114 and the upper surface 111 of the leads 110 is an acute angle to stop the bumps 123, solder materials or bonding materials from wetting and diffusing over the indentations 114. Therefore, the soldering area of the bump-bonding regions 113 can be effectively defined by the indentations 114. The indentations 114 may be created by means of half-etching or mold compressing technique. In this embodiment, the leads 110 are passed through a half-etching process such that the indentations 114 have a depth about 50 μm. In detail, a plurality of recessions 117 can be formed by half-etching on the lower surfaces 112 of the leads 110 and have a depth about 100 μm. The recessions 117 is formed between the outer connecting regions 115 and the indentations 114 for filling the molding compound 130.

The flip chip 120 is mounted on the leads 110 by flip chip technology. The flip chip 120 has an active surface 121 and a back surface 122 opposing to the active surface 121. A plurality of bumps 123, such as lead-tin bumps or lead-free bumps, are formed on the active surface 121 to serve as solder terminals for electrically connecting the internal integrated circuits of the chip 120 to the leadframe. In this embodiment, the bumps 123 are arranged at the periphery of the active surface 121, and the active surface 121 of the flip chip 120 faces the leads 110 after flip chip mounting. The bumps 123 are bonded onto the bump-bonding regions 113 of the leads 110 by a reflowing process. The indentations 114 are able to prevent the bumps 123 from excessively wetting or solder diffusion. Therefore, the bumps 123 are limited on the bump-bonding regions 113 without bump collapse or solder diffusion over other portions on the upper surfaces 111 of the leads 110 in replacement of the well-known solder mask on a leadframe. Usually the lower surfaces 112 of the leads 110 corresponding to the bump-bonding regions 113 are formed without etching to form a plurality of supporting portions 118. It is advantageous to support the leads 110 during flip chip mounting. The supporting portions 118 may be coplanar with the outer connecting regions 115 for a better support.

The molding compound 130 encapsulates the flip chip 120 and parts of the leads 110. The indentations 114 and the recessions 117 of the leads 110 are all covered with the molding compound 130 to firmly fix the leads 110. The molding compound 130 is formed by conventional molding technique. The outer connecting regions 115 and the supporting portions 118 are exposed out of the molding compound 130. The bumps 123 of the flip chip 120 are effectively limited on the bump-bonding regions 113 without bump collapse. Moreover, there is no solder diffusion or contamination occurred on other portions of the leads 110 except for the bump-bonding regions 113 during reflowing process. In addition, the indentations 114 may be filled with the molding compound 130 to firmly fix the fan-in ends of the leads 110.

Figure 2:
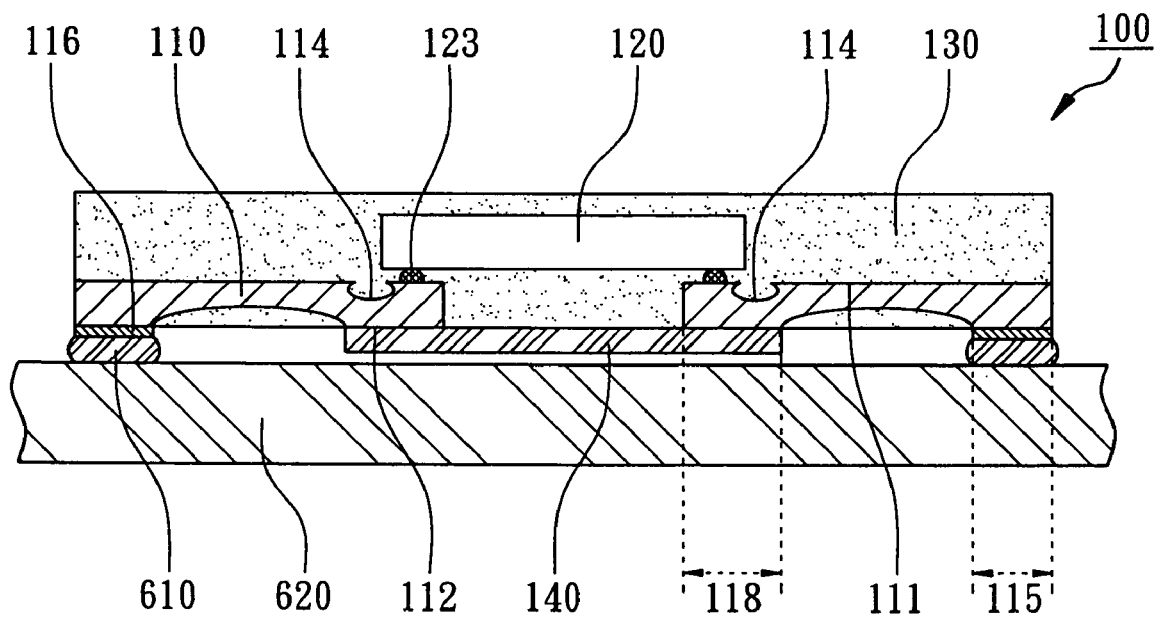
FIG. 2 is a cross sectional view of the semiconductor package in SMT connection with an external printed circuit board in accordance with the first embodiment of the present invention.

Referring to FIG. 2, a back tape 140 is attached to the supporting portions 118 of the leads 110 in this embodiment. When the semiconductor package 100 is surface-mounted onto an external printed circuit board 620, a pre-solder material 610 or other connecting material is formed on the outer connecting regions 115 of the leads 110 to connect with the external printed circuit board 620. The back tape 140 on the supporting portions 118 is utilized to prevent the pre-solder material 610 on the outer connecting regions 115 from contaminating the supporting portions 118 to cause electrical short-circuit and, moreover, to firmly fix the leads 110. Also, the back tape 140 is thermal conductive to improve reliability of the molding compound. The back tape 140 has a thickness 50-100 μm approximately.

Figure 3:
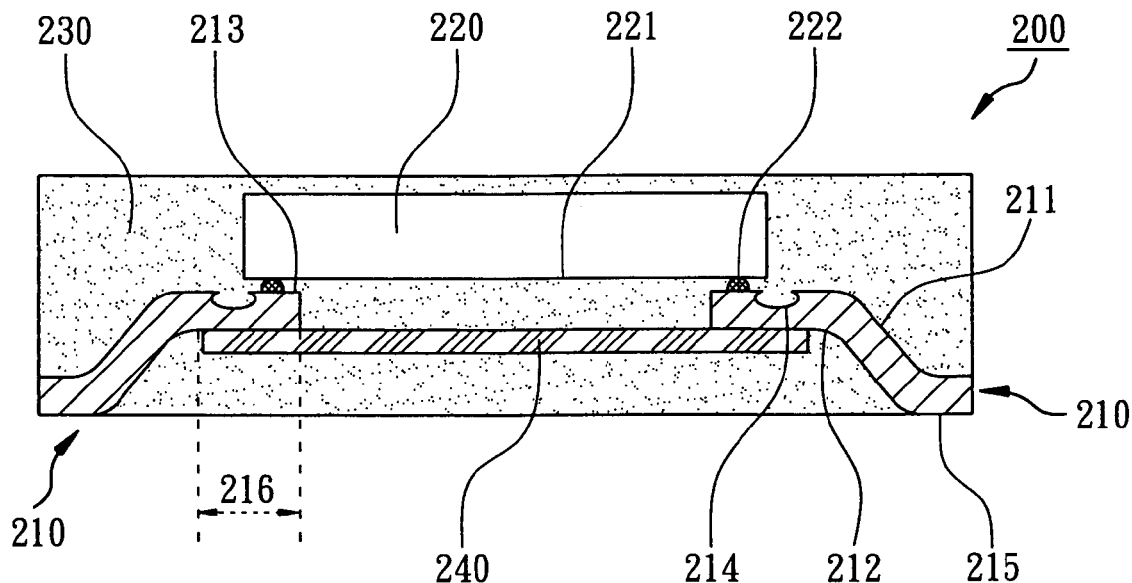
FIG. 3 is a cross sectional view of a semiconductor package in accordance with the second embodiment of the present invention.

The second embodiment of the present invention discloses another semiconductor package with a flip chip on a leadframe. Referring to FIG. 3, the semiconductor package 200 generally includes a plurality of leads 210, a flip chip 220 and a molding compound 230. The flip chip 220 is mounted on the leads 210 and encapsulated by the molding compound 230. Each lead 210 has an upper surface 211 and a lower surface 212. A plurality of bump-bonding regions 213 are formed on the upper surfaces 211 and at the fan-in ends of the lead 210, and are defined by a plurality of adjacent indentations 214. The indentations 214 preferably have a reversed "Ω"-shaped profile to prevent the bumps 222 on the active surface 221 of the chip 220 from excessively wetting and diffusion. The indentations 214 can be filled with the molding compound 230. The leads 210 are bended to allow the fan-in ends including the bump-bonding regions 213 are formed on an upset 216 for flip chip mounting of the flip chip 220. The lower surfaces 212 of the leads 210 are covered by the molding compound 230 except for the outer connecting regions 215 at the fan-out ends of the leads 210. The molding compound 230 substantially encapsulates the flip chip 220. Therefore, the indentations 214 of the leads 210 can effectively limit the bumps 222 to the bump-bonding regions 213 of the leads 210 without solder diffusion. It is preferable to attach a back tape 240 on the lower surfaces 212 of the leads 210 corresponding to the bump-bonding regions 213. It can firmly fix the fan-in ends of the leads 210 and keep the bump-bonding regions 213 of the leads 210 on the upset 216. In this embodiment, the back tape 240 is also encapsulated by the molding compound 230.

Figure 4:
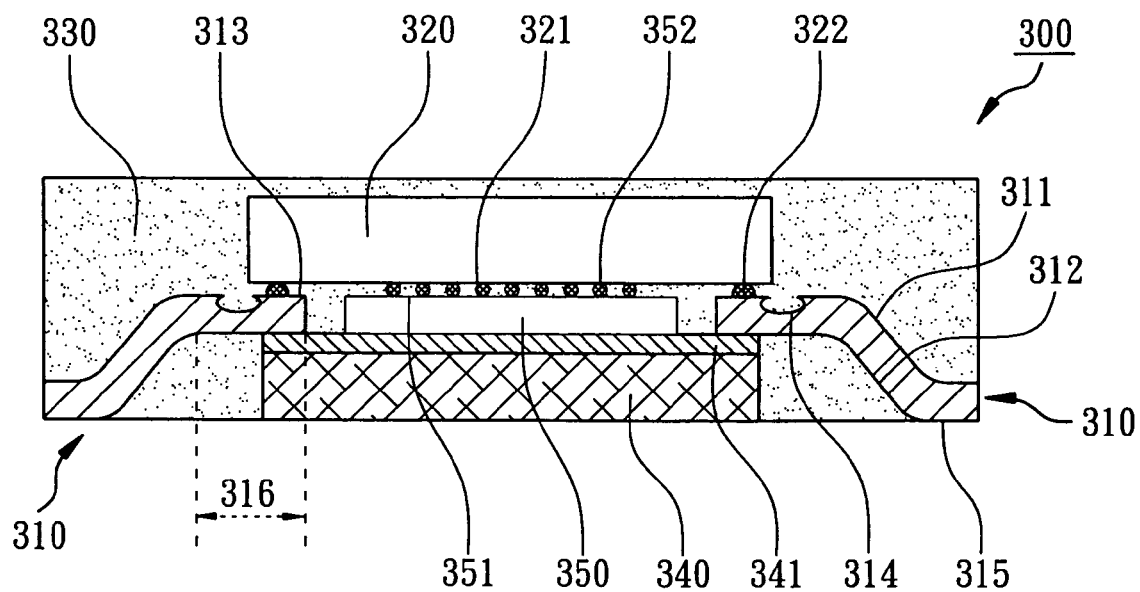
FIG. 4 is a cross sectional view of a semiconductor package in accordance with the third embodiment of the present invention.

In the third embodiment of the present invention, a semiconductor package is illuminated. Referring to FIG. 4, a semiconductor package 300 includes a plurality of leads 310, a first flip chip 320, a molding compound 330 and a heat sink 340. The leads 310, the first flip chip 320 and the molding compound 330 in this embodiment are almost the same as those used in the second embodiment. A plurality of bump-bonding regions 313 on the upper surfaces 311 and a plurality of adjacent indentations 314 are formed at the fan-in ends of the leads 310. The indentations 314 are utilized for preventing the bumps 322 on the active surface 321 of the first flip chip 320 from excessively wetting and diffusing over the other upper surfaces 311 of the leads 310 except for the bump-bonding regions 313. The indentations 314 can be filled with the molding compound 330. The heat sink 340 is also disposed inside the molding compound 330 and attached to the lower surfaces 312 at the upset 316 of the leads 310 by using a dielectric adhesive layer 341 to support the fan-in ends of the leads 310 and to improve heat dissipation. A plurality of outer connecting regions 315 on the lower surfaces 312 are formed at the fan-out ends of the leads 310 to expose out of the molding compound 330 as externally electrical connections. The semiconductor package 300 can further comprises a second flip chip 350. The second flip chip 350 includes a plurality of bumps 352 formed on active surface thereof, so as to mount the second flip chip 350 to the first flip chip 320.

Figure 5:
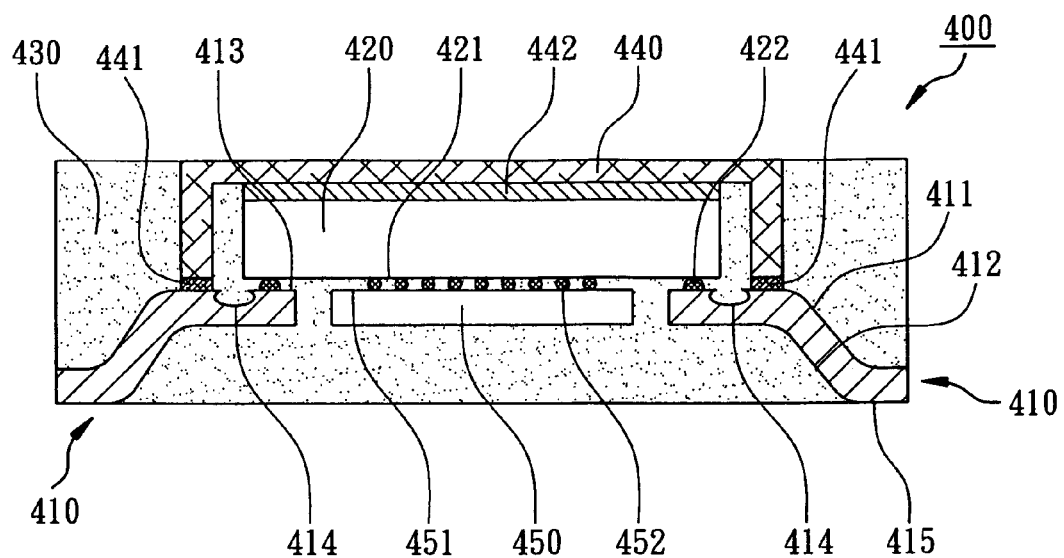
FIG. 5 is a cross sectional view of a semiconductor package in accordance with the fourth embodiment of the present invention.

In the fourth embodiment of the present invention, a semiconductor package 400 is shown in FIG. 5. The semiconductor package 400 mainly includes a plurality of leads 410, a first flip chip 420, a molding compound 430, a heat sink 440 and at least a second flip chip 450. The leads 410, the first flip chip 420, the molding compound 430 and the second flip chip 450 of this embodiment are almost the same as those used in the third embodiment. A plurality of bump-bonding regions 413 on the upper surfaces 411 and a plurality of indentations 414 adjacent to the bump-bonding regions 413 are formed at the fan-in ends of the leads 410. The indentations 414 are utilized to prevent the bumps 422 on the active surface 421 of the first chip 420 from excessively wetting and spreading over the other upper surfaces 411 of the leads 410 expect for the bump-bonding regions 413. Moreover, the molding compound 430 can fill the indentations 414. A plurality of outer connecting regions 415 uncovered by the molding compound 430 are formed at the fan-out end of the lower surfaces 412 of the leads 410, and a plurality of bumps 452 are formed on the active surface 451 of the second flip chip 450 to be utilized for flip chip mounting the second flip chip 450 onto active surface 421 of the first flip chip 420. The heat sink 440 is disposed on the upper surfaces 411 of the leads 410 and has a bonding portion 441 connected to the upper surfaces 411 of the leads 410 by insulating adhesive. Moreover, the heat sink 440 is located such that the indentations 414 are formed between the bump-bonding regions 413 and the bonding portion 441. Preferably, a thermal interface material 442 can thermally couple the back surface of the first chip 420 to the heat sink 440 to improve heat dissipating efficiency.

Figure 6:
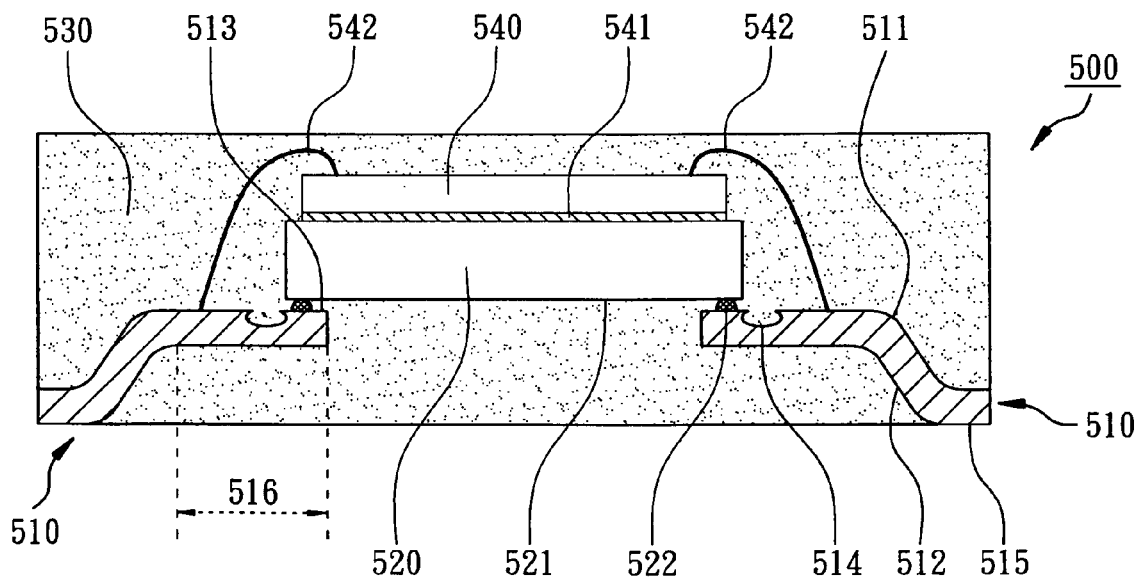
FIG. 6 is a cross sectional view of a semiconductor package in accordance with the fifth embodiment of the present invention.

In the fifth embodiment of the present invention, a semiconductor package is shown in FIG. 6. The semiconductor package 500 mainly includes a plurality of leads 510, a first chip 520, a molding compound 530 and a second chip 540. The leads 510, the first chip 520, the molding compound 530 in this embodiment are almost the same as those used in the second embodiment. A plurality of bump-bonding regions 513 on the upper surfaces 511 and a plurality of indentations 514 adjacent to the bump-bonding regions 513 are formed at the fan-in end of the leads 510. The indentations 514 may have a reversed "Ω"-shaped profile. A plurality of outer connecting regions 515 on the lower surfaces 512 are formed at the fan-out ends of the leads 510 and uncovered by the molding compound 530. A plurality of bumps 522 formed on the active surface 521 of the first chip 520 are bonded to the bump-bonding regions 513 of the leads 510 without overspreading to the other portions of the upper surfaces 511 of the leads 510 by means of the indentations 514. The second chip 540 is attached to the back surface of the first chip 520 by using an adhesive layer 541 and electrically connected with the upper surfaces 511 of the leads 510 by using a plurality of bonding wires 542 (like gold wires).

However, the present invention does not limit that each lead only has an indentation adjacent to corresponding bump-bonding region. There are several indentations can be formed to each bump-bonding region of corresponding leads, and then being filled with the molding compound. The leadframe can also include conventional leads without indentations, such as random combinations having bus bars, ground leads or dummy leads.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A semiconductor package comprising:
   a plurality of leads, each having an upper surface and an opposing lower surface, wherein the upper surfaces of the leads include a plurality of bump-bonding regions at one ends of the leads, the lower surfaces of the leads include a plurality of outer connecting regions at the another ends of the leads and a plurality of supporting portions corresponding to the bump-bonding regions;
   a flip chip located on the bump-bonding regions of the leads;
   a plurality of bumps connecting the flip chip to the bump-bonding regions of the leads; and
   a molding compound encapsulating the flip chip and covering the upper surfaces of the leads, the outer connecting regions and the supporting portions being exposed out of the molding compound;
   wherein the leads have a plurality of indentations formed at the upper surfaces of the leads, the indentations are adjacent to the corresponding bump-bonding regions and filled with the molding compound and a back tape attached to the supporting portions of the leads.

2. The semiconductor package in accordance with claim 1, wherein the indentations have a reversed "Ω"-shaped profile.

3. The semiconductor package in accordance with claim 1, wherein the indentations are formed by half-etching method.

4. The semiconductor package in accordance with claim 1, wherein the indentations have a depth about 50 μm.

5. The semiconductor package in accordance with claim 1, wherein the leads have a length more than 600 μm.

6. The semiconductor package in accordance with claim 1, wherein the leads have a plurality of recessions in the lower surfaces of the leads.

7. The semiconductor package in accordance with claim 6, wherein the recessions have a depth about 100 μm.

8. A leadframe for semiconductor packages, comprising a plurality of leads, each having an upper surface and an opposing lower surface, wherein the upper surfaces of the leads include a plurality of bump-bonding regions at one ends of the leads, the lower surfaces of the leads include a plurality of outer connecting regions at another ends of the leads, wherein the leads have a plurality of indentations formed at the upper surfaces of the leads, the indentations are adjacent to the corresponding bump-bonding regions, wherein a back tape is attached to the lower surfaces of the leads.

9. The leadframe in accordance with claim 8, wherein the indentations have a reversed "Ω"-shaped profiled.

10. The leadframe in accordance with claim 8, wherein the indentations are formed by half-etching method.

11. The leadframe in accordance with claim 8, wherein the indentations have a depth about 50 μm.

12. The leadframe in accordance with claim 8, wherein the leads have a length more than 600 μm.

13. The leadframe in accordance with claim 8, wherein the leads have a plurality of recessions in the lower surfaces of the leads.

14. The leadframe in accordance with claim 13, wherein the recessions have a depth about 100 μm.

* * * * *